United States Patent [19]

Besmann et al.

[11] Patent Number: 4,929,328

[45] Date of Patent: May 29, 1990

[54] TITANIUM DIBORIDE CERAMIC FIBER COMPOSITES FOR HALL-HEROULT CELLS

[75] Inventors: Theodore M. Besmann; Richard A. Lowden, both of Knoxville, Tenn.

[73] Assignee: Martin Marietta Energy Systems, Inc., Oak Ridge, Tenn.

[21] Appl. No.: 319,770

[22] Filed: Mar. 7, 1989

[51] Int. Cl.$^5$ .............................................. C25C 7/02
[52] U.S. Cl. ................................ 204/279; 204/243 R; 204/290 R; 204/291; 204/294; 427/113; 427/122; 427/126.1; 427/126.2; 427/255; 428/113; 428/307.7; 501/95
[58] Field of Search ............... 204/243 R, 290 R, 291, 204/294, 279; 501/88, 92, 95; 427/113, 255, 243, 122, 126.1, 126.2; 428/113, 307.7

[56] References Cited

U.S. PATENT DOCUMENTS

| | | | |
|---|---|---|---|
| 4,093,524 | 6/1978 | Payne | 204/290 R |
| 4,308,115 | 12/1981 | Foster, Jr. et al. | 204/290 R |
| 4,511,449 | 4/1985 | Molnar | 204/294 |
| 4,580,524 | 4/1986 | Lackey et al. | 118/725 |
| 4,598,024 | 7/1986 | Stinton et al. | 428/448 |

OTHER PUBLICATIONS

Immersion Tests of TiB$_2$-Based Materials for Aluminum Processing Applications, 2 C. H. Schilling and G. L. Graff, Excerpts from U.S. DOE Report No. PNL-6593, pp. 21–28 (Jul. 1988).
Development of Monolithic Titanium Diboride Cathodes for Retrofit Hall Cell Applications, R. C. Dorward & J. R. Payne, U.S. DOE Report No. DOE/CS/40215/1.
An Evaluation of a Titanium Diboride-Composite Material as Cathodes for Low Energy Alumina Reduction Cells, R. C. Dorward Cathodes for Low Energy Alumina Reduction Cells, R. C. Doward & J. R. Payne, U.S. DOE Report No. DOE/CS/40215/2.
K. Billehaug et al., "Inert Cathodes for Aluminum Electrolysis in Hall-Heroult Cells (I)," Aluminum, V.56, pp. 643–648 (Jan. 1980).
W. A. Zdaniewski, "Role of Microstructure & Intergranular Phases in Stress Corrosion of TiB$_2$ Exposed to Liquid Aluminum" J. Am. Ceram. Soc., vol. 68, pp. C-309-C-312 (1985).
C. B. Finch et al., "Crack Formation & Swelling of TiB$_2$-Ni Ceramics in Liquid Aluminum," J. Am. Society, vol. 65, #7, pp. C-100-C-101 (1982).
D. P. Stinton et al., "Synthesis of Fiber-Reinforced SiC Composites by Chemical Vapor Deposition" Am. Ceram. Soc. Bull., vol. 65 #2, pp. 347–350 (1986).
J. B. Todd, "Energy Reduction in Hall-Heroult Cells with Conventional and Special Electrodes," Journal of Metals, Sep. 1981, pp. 42–45.

*Primary Examiner*—John F. Niebling
*Assistant Examiner*—Kathryn Gorgos
*Attorney, Agent, or Firm*—James D. Griffin; Bruce M. Winchell

[57] ABSTRACT

An improved cathode structure for Hall-Heroult cells for the electrolytic production of aluminum metal. This cathode structure is a preform fiber base material that is infiltrated with electrically conductive titanium diboride using chemical vapor infiltration techniques. The structure exhibits good fracture toughness, and is sufficiently resistant to attack by molten aluminum. Typically, the base can be made from a mat of high purity silicon carbide fibers. Other ceramic or carbon fibers that do not degrade at temperatures below about 1000 deg. C can be used.

20 Claims, No Drawings

TITANIUM DIBORIDE CERAMIC FIBER COMPOSITES FOR HALL-HEROULT CELLS

The U.S. Government has rights in this invention pursuant to Contract No. DE-AC05-84OR21400 with Martin Marietta Energy Systems, Inc., awarded by the U. S. Department of Energy and funded through the Energy Conversion and Utilization Technologies (ECUT) Material Program.

TECHNICAL FIELD

This invention relates generally to electrode materials for electrolytic cells, and more particularly to an improved electrode composition for use in Hall-Heroult cells as utilized in the electrolytic production of aluminum metal.

BACKGROUND ART

The aluminum industry is reported to consume approximately 7% of all electrical energy used in industry in the U.S. for the production of primary aluminum metal, i.e., metal derived from ore as distinct form recycled aluminum. The current annual domestic capacity for primary metal production is about 5 million tons, which represents a daily energy use of approximately 200 million killowatt-hours. Although the average U.S. specific energy consumption has been reduced about 30% over the past twenty-five years, significant further savings with present technology appear possible only in newly constructed smelters. Unfortunately, the aluminum industry is one of the most capital intensive: replacing the complete U.S. reduction capacity with new low-energy type reduction cells would require an enormous investment. This is economically impractical; a better solution is a means of reducing the energy required to produce aluminum in existing facilities.

The Hall-Heroult smelting process (referred to hereinafter as the Hall Process), in which alumina is dissolved in molten $NaF$—$AlF_3$ salt at 940–980 deg. C and electrolytically decomposed with direct current, is universally used to make aluminum metal. A typical aluminum smelter (Hall cell) has an energy efficiency of about 40%. A major portion of the energy consumed in the process can be attributed to the voltage drop between the anode and cathode. The spacing between the anode aND cathode (known as the anode-cathode distance, or ACD) must be maintained at 4–5 cm to prevent electrical shortage between the carbon anode and the molten aluminum pool which serves as the cell cathode. Therefore, if it were possible to replace the turbulent metal cathode with a dimensionally stable cathode, the ACD would be reduced significantly with a concomitant saving in energy.

The potential benefits of using electrically conductive titanium diboride ($TiB_2$) for this cathode application have been recognized for over twenty-five years. However, past attempts to apply $TiB_2$ cathodes to full-size reduction cells have been frustrated by short-lived parts. The materials that have been available were susceptible to intergranular penetration by molten aluminum, which eventually resulted in complete physical disintegration. This is caused by intergranular swelling occuring as a result of the reduction of grain boundry oxide impurities by aluminum that penetrates these bodies. This attack may be, in part, caused by the sintering aid necessary for making $TiB_2$ bodies. Other material properties compounded this problem: $TiB_2$ is brittle, thermal shock sensitive, and cannot withstand mechanical impact.

As improved $TiB_2$ materials have been developed, additional studies have been made. Some improvement in longevity of the cathode parts have been demonstrated by Kaiser aluminum and chemical corporation under contract with the U.S. Department of Energy. This work has been reported in Reports DOE/CS/40215-1 and -2. The cathode constructions investigated were components fabricated from hot-pressed $TiB_2$, and carbon blocks coated (troweled coatings or glued prebaked plates on carbon) with $TiB_2$. Of these, the coated cathode structures were superior to the hot-pressed bodies; however, the costs of fabrication are high (large quantities of $TiB_2$ are required) and the performance in molten aluminum was marginal.

Accordingly, it is an object of the present invention to provide a cathode structure for a Hall cell that permits use of a smaller anode-cathode distrance than in conventional Hall cells.

It is another object to provide a titanium diboride cathode structure for use in a Hall cell that has sufficient integrety so as to reduce replacement cycles for use in the cell.

Another object of the present invention is to provide suitable titanium diboride cathode for Hall cells that can be fabricated at reduced cost by reducing to a minimum the requirement for costly $TiB_2$.

A further object is to provide a cathode structure for Hall cells that has improved fracture toughness and utilizes no sintering aid to give rise to deleterious attack.

These and other objects of the invention will become apparent upon a consideration of the full description hereinafter.

DISCLOSURE OF THE INVENTION

In accordance with the present invention, there is provided a cathode structure for a Hall cell that is fabricated by infiltrating a fibrous ceramic preform or a ceramic cloth with titanium diboride using chemical vapor infiltration (CVI) methods. In the preferred form of the invention, a preform of ceramic or carbon fibers is impregnated and coated by $TiB_2$ using CVI. This results in a body that has withstood Hall cell condition for at least thirty days (fourteen days considered suitable).

BEST MODE FOR CARRYING OUT THE INVENTION

Cathode components of the present invention for Hall cells utilize a fibrous "preform" made from one or more layers of a carbon or ceramic cloth or a felt of chopped ceramic fibers. If more than one layer of cloth is used to make the preform, each layer is typically oriented so that the tows of each layer are sequentially 30-60-90 degrees relative to each other. In felts, the chopped fibers have no specific orientation and thus are randomly oriented. The fibers used can be of several types based upon silicon carbide (SiC), alumina ($Al_2O_3$), aluminum nitride (AlN), boron nitride (BN), mullite, etc. These materials have a relatively good resistance to attack by molten aluminum and are otherwise stable at the temperatures of the cell.

The preform is produced by placing the desired cloth layers in a graphite die of a desired size and shape. If the ultimate product is to have flanges and or attachment holes, such are taken into account in the form of the die. The material in the die is compressed sufficiently to permit handling and achieve a desired porosity. While still in the die, the preformed is washed (as with acetone) to remove any sizing present on the fibers, and then dried.

The die holder, with the preform therein, is transferred to a chemical vapor infiltration furnace of a conventional design (see, for example, U.S. Pat. No. 4,580,524 issued to W. J. Lackey, et al on Apr. 8, 1986). The holder rests on a metal water-cooled gas injector, the top of which is typically at about 60 degrees C. Infiltration and deposition of $TiB_2$ is carried out at atmospheric pressure, with the furnace nominal temperature of about 900 deg. C to about 1200 deg. C. Other known chemical vapor infiltration apparatus and methods can be used. For example, the infiltration can be carried out without the thermal gradient. Infiltration without the gradient is deemed to reduce the amount of residual chlorine in the materials.

The reactant gases for the CV infiltration of the preform are hydrogen, boron trichloride ($BCl_3$) and titanium tetrachloride ($TiCl_4$). Typically the flow rates of these reactant gases are 1000 (standard cubic centimeters per minute) 50 sccm and 0.10 g/min, respectively. A higher hydrogen will also reduce the residual chlorine in the fibers. The reactant gases are forced through one or more small holes (e.g., 3 mm) in the bottom of the graphite holder and through the preform where they decompose to form the $TiB_2$/ceramic matrix. The effluent gases are drawn out of the holder and the furnace. Varying degrees of infiltration can be accomplished in this manner in order to control the degree of porosity, and therefore the available $TiB_2$ surface area per unit volume of the finished electrode.

In a preferred form of the invention, a thin precoat layer is applied to the surface of the fibers of the preform before the CVI of the $TiB_2$. Pyrolytic carbon, e.g. derived from propylene, is typically used for this purpose having a thickness of about 0.2 $\mu m$ (micrometer). The precoat modifies the fiber matrix bond and protects the fibers from the aforesaid reactant gases. The entire infiltration requires, typically, 24 to 48 hours depending upon the original density of the preform, the component thickness, the furnace temperature and the desired final density of the composite.

A $TiB_2$-ceramic unit was prepared as described above using layers of Nicalon cloth (SiC). This unit was then exposed to molten aluminum under conditions simulating cell operation. The temperature was, for example, about 970 deg. C. After about thirty hours of exposure, the specimen appeared to be unaffected by the aluminum. After exposure to molten Al for four weeks, the $TiB_2$ coating on the fibers appeared to be intact; however, some of the fibers of the mesh exhibited features suggesting that chemical attack had occurred. The fibers did not exhibit cracks in the unexposed sample; however, some microcracks were noted in the $TiB_2$ coating. Some aluminum was observed to have penetrated some cracks in the $TiB_2$.

Penetration by aluminum and some deterioration of the fibers was more pronounced after exposure to the molten aluminum for ten and twenty weeks. The $TiB_2$ coatings were largely intact after these longer exposure, although the $TiB_2$ had deteriorated in regions near the fibers. However, the total body had maintained its integrety.

Deterioration of the Nicalon fibers of the matrix may be due, in part, to various reactive components, such as carbon and $SiO_2$ in the fibers. A silicon carbide fiber cloth or mesh without these "impurities" should withstand deterioration. However, some of the deterioration may be due to thermal degradation of these SiC fibers that has been observed in other studies at temperatures above about 1000 deg. C. Even with the deterioration noted, a cathode fabricated by CVI of $TIB_2$ on silicon carbide fiber base material is an improvement over other solid-type cathodes of the prior art.

Other high temperature ceramic fiber structures are known that are less susceptible to deterioration at the temperature of the molten aluminum. These include, for example, aluminum nitride (AlN), boron nitride (BN) and alumina ($Al_2O_3$). Accordingly, a base material of ceramic fibers selected from this group can be substantially infiltrated with $TiB_2$ by CVI techniques to form structures that are compatible with molten aluminum to form a cathode for Hall Cells. The $TiB_2$ provides the electrical conductivity of the body since the base materials generally exhibit insulative properties. Since the ceramic fiber base material infiltrated with $TiB_2$ by CVI is physically strong, a cathode fabricated by this method will not exhibit the brittle, and thus damaging, property of $TiB_2$ structures investigated in the past.

Another material that is sufficiently stable is molten aluminum is a preform of carbon fibers. Such preforms (of cloth or felt) can be prepared by any suitable method, as will be known by those versed in the art. Preforms of carbon fibers were infiltrated with pyrolytic carbon to produce a precoat of about 0.2 $\mu m$ after which the preform was subjected to chemical vapor infiltration as described above. The precoat served to protect the fibers from attack by the chloride reactants, and modifies the fiber-matrix bond to optimize the mechanical properties (strength and toughness) of the resultant cathode body. These bodies were infiltrated to theoretical densities of 88%, and exhibited room temperature flexure strengths (in four point bending) of 190±25 MPa.

The present invention provides numerous advantages over the $TiB_2$ electrodes of the prior art. Since only modest temperatures are utilized in the CVD method of infiltration, the probability of incorporating container materials in the deposit is very low. Thus, since the reactant gases be made very pure, the deposited $TiB_2$ will be of very high purity. This process also eliminates the need for sintering aids required for the hot-pressing of $TiB_2$, and relatively small quantities of $TiB_2$ are used (because thin components can be utilized) as contrasted to other processes. These $TiB_2$-ceramic (or carbon) structures exhibit a fracture toughness well in excess of that for compacted $TiB_2$ which is a typically brittle ceramic. Thus, the handling of the cathode formed from the $TiB_2$ ceramic (or carbon) fiber structure will not impair its function in contrast to the structures of the prior art.

From the foregoing, it will be understood by those versed in the art that an improved cathode composition has been developed for Hall cells used in the electrolytic manufacture of aluminum. Although limited examples of the composition have been described, these are not to be construed as a limitation on the invention. Rather, the invention is to be limited only by the appended claims and their equivalents.

We claim:
1. A structure compatible with molten aluminum, which comprises a preform matrix of fibers stable in molten aluminum, said preform infiltrated with titanium diboride by chemical vapor infiltration to coat said fibers and produce substantially theoretical density to said structure.

2. The structure of claim 1 wherein said fibers are chosen from the group consisting of silicon carbide, carbon, aluminum, mullite, boron nitride, aluminum nitride and mixtures thereof.

3. The structure of claim 1 wherein said infiltration is accomplished using, as reactant gases, hydrogen, boron trichloride and titanium tetrachloride at a temperature of about 900 deg. C.

4. The structure of claim 3 wherein said reactant gases are passed through said preform matrix at flow rates of about 1000 sccm hydrogen, 50 sccm boron trichloride and 0.10 g/min titanium tetrachloride.

5. The structure of claim 1 further comprising a layer of pyrolytic carbon deposited on said fibers prior to said infiltration and coating with said titanium diboride.

6. The structure of claim 1 wherein said preform matrix is a pressed composite of chopped fibers.

7. The structure of claim 1 wherein said preform matrix is a pressed composite of multilayers of a cloth fabricated from said fibers.

8. The structure of claim 7 wherein tows of said layers of cloth are oriented at selected angles in adjacent layers to form said preform matrix with substantially randomly oriented fibers.

9. The structure of claim 2 wherein said fibers are carbon.

10. A composite unit for use as a cathode structure in Hall-Heroult electrolysis cells for aluminum smelting, which comprises a preform matrix of fibers selected from fibers of silicon carbide, carbon, alumina, mullite, aluminum nitride, boron nitride and mixtures thereof, said preform matrix being infiltrated with titanium diboride by vapor infiltration to coat said fibers and produce a substantially theoretical density to said structure.

11. The composite of claim 10 wherein said infiltration is accomplished using, as reactant gases, hydrogen, boron trichloride and titanium tetrachloride at a temperature of about 900 deg. C.

12. The composite unit of claim 11 wherein said reactant gases are passed through said preform at flow rates of about 1000 sccm hydrogen, 50 sccm boron trichloride and 0.10 g/min titanium tetrachloride.

13. The composite unit of claim 10 further comprising a layer of pyrolytic carbon deposited on said fibers prior to said infiltration and coating with said titanium diboride.

14. The composite unit of claim 10 wherein said ceramic fibers are silicon carbide.

15. The composite unit of claim 10 wherein said preform matrix is a pressed composite of chopped fibers.

16. The composite unit of claim 10 wherein said preform matrix is a pressed composite of multilayers of a cloth fabricated from said fibers wherein tows of said layers of cloth are oriented at selected angles in adjacent layers to form said preform matrix with substantially randomly oriented fibers.

17. The composite unit of claim 10 wherein said preform matrix is provided with means for supporting said cathode structure in said cells prior to said infiltrating with said titanium diboride.

18. A cathode structure for use in a Hall-Heroult electrolysis cell for aluminum smelting, which comprises:
a preform matrix of matrix of fibers selected from fibers of silicon carbide, carbon, alumina, mullite, aluminum nitride, boron nitride and mixtures thereof, said preform matrix provided with means for mounting said cathode in said cell; and
an infiltration of titanium diboride throughout said preform matrix to coat said fibers and provide a substantially theoretical density to said cathode, said infiltration being a result of passing hydrogen, boron trichloride and titanium tetrachloride through said preform matrix while maintaining said preform matrix at about 900 deg. C.

19. The cathode structure of claim 18 further comprising a layer of pyrolytic carbon intermediate said fibers and said titanium diboride, said layer of pyrolytic carbon being about 0.2 $\mu$m thick and formed by the decomposition of propylene.

20. The structure of claim 18 wherein said fibers of said preform matrix are carbon fibers.

* * * * *